United States Patent
Riedl et al.

(10) Patent No.: US 8,410,586 B2
(45) Date of Patent: Apr. 2, 2013

(54) SEMICONDUCTOR PACKAGE AND METHOD OF ASSEMBLING A SEMICONDUCTOR PACKAGE

(75) Inventors: Edmund Riedl, Obertraubling-Gebelkofen (DE); Steffen Jordan, Viehhausen (DE); Christof Matthias Schilz, Dresden (DE); Fee Hoon Wong, Melaka (MY)

(73) Assignee: Infineon Technologies, AG, Neubiberg (DE)

( * ) Notice: Subject to any disclaimer, the term of this patent is extended or adjusted under 35 U.S.C. 154(b) by 711 days.

(21) Appl. No.: 12/247,031

(22) Filed: Oct. 7, 2008

(65) Prior Publication Data

US 2009/0065912 A1    Mar. 12, 2009

Related U.S. Application Data

(63) Continuation of application No. PCT/IB2006/001218, filed on May 10, 2006.

(51) Int. Cl.
*H01L 21/50* (2006.01)
*H01L 23/495* (2006.01)

(52) U.S. Cl. ............ 257/666; 257/690; 257/E21.499; 257/E23.031; 438/118

(58) Field of Classification Search ............ 257/666, 257/690, E21.499, E23.031; 438/118
See application file for complete search history.

(56) References Cited

U.S. PATENT DOCUMENTS

| | | | | |
|---|---|---|---|---|
| 3,986,897 A * | 10/1976 | McMillan et al. | 438/510 |
| 4,517,734 A * | 5/1985 | Rubin | 438/611 |
| 5,250,363 A * | 10/1993 | Chen | 428/607 |
| 5,343,073 A * | 8/1994 | Parthasarathi et al. | 257/666 |
| 5,543,586 A * | 8/1996 | Crane et al. | 174/262 |
| 5,982,041 A * | 11/1999 | Mitani et al. | 257/783 |
| 6,046,507 A * | 4/2000 | Hatchard et al. | 257/790 |
| 6,777,788 B1 * | 8/2004 | Wan et al. | 257/670 |
| 6,831,372 B2 * | 12/2004 | Ruhland | 257/783 |
| 6,852,567 B1 * | 2/2005 | Lee et al. | 438/106 |
| 7,205,180 B1 * | 4/2007 | Sirinorakul et al. | 438/123 |
| 7,327,017 B2 * | 2/2008 | Sirinorakul et al. | 257/666 |
| 2002/0153596 A1 * | 10/2002 | Tsubosaki et al. | 257/666 |
| 2003/0013235 A1 * | 1/2003 | Featherby et al. | 438/127 |
| 2003/0075792 A1 * | 4/2003 | Ruhland | 257/693 |
| 2004/0232534 A1 * | 11/2004 | Seki et al. | 257/678 |
| 2006/0154103 A1 * | 7/2006 | Riedl et al. | 428/621 |

FOREIGN PATENT DOCUMENTS

| | | |
|---|---|---|
| DE | 10124047 B4 | 11/2002 |
| DE | 10148120 A1 | 4/2003 |
| WO | 0074131 A1 | 12/2000 |
| WO | 2006034682 A1 | 4/2006 |

* cited by examiner

*Primary Examiner* — Ha Tran T Nguyen
*Assistant Examiner* — Jordan Klein
(74) *Attorney, Agent, or Firm* — Edell, Shapiro & Finnan, LLC

(57) ABSTRACT

A semiconductor package includes a semiconductor component including a circuit carrier with a plurality of inner contact pads, a semiconductor chip, and a plurality of electrical connections. An adhesion promotion layer is disposed on at least areas of the semiconductor component and a plastic encapsulation material encapsulates at least the semiconductor chip, the plurality of electrical connections and the plurality of inner contact pads. Surface regions of the semiconductor component are selectively activated.

24 Claims, 4 Drawing Sheets

Figure 3:
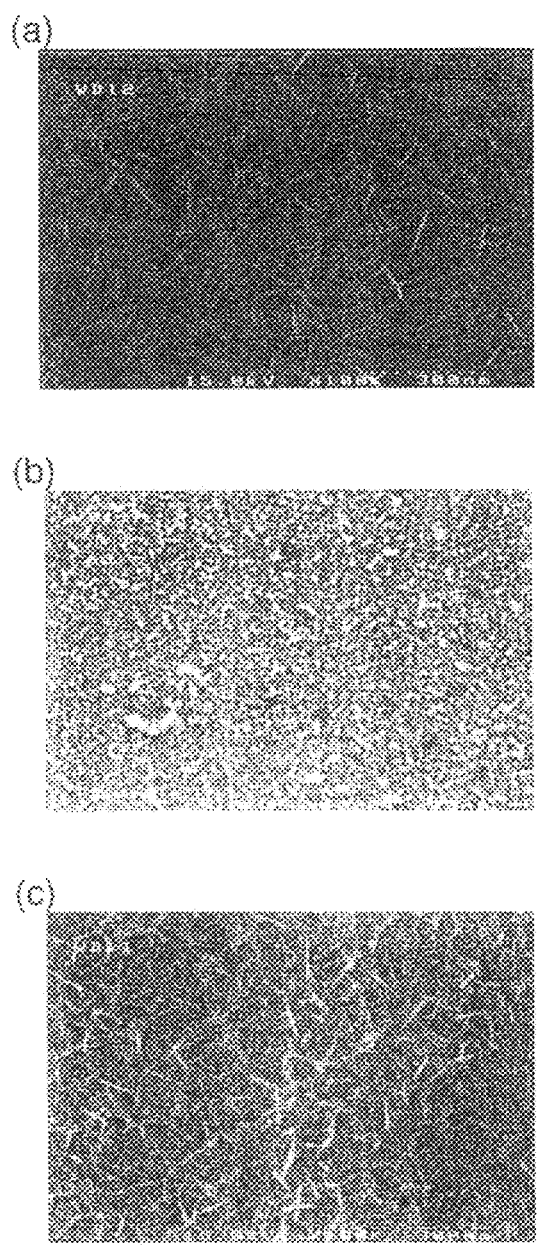

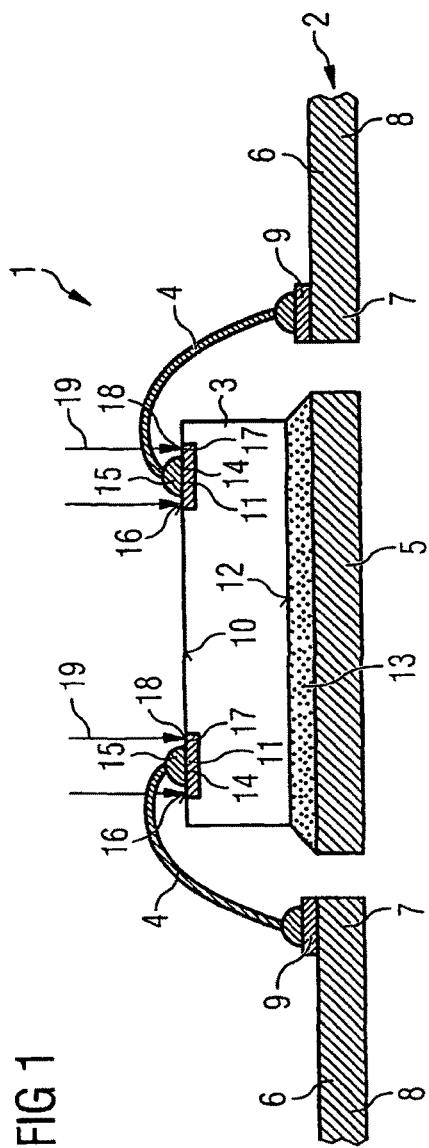
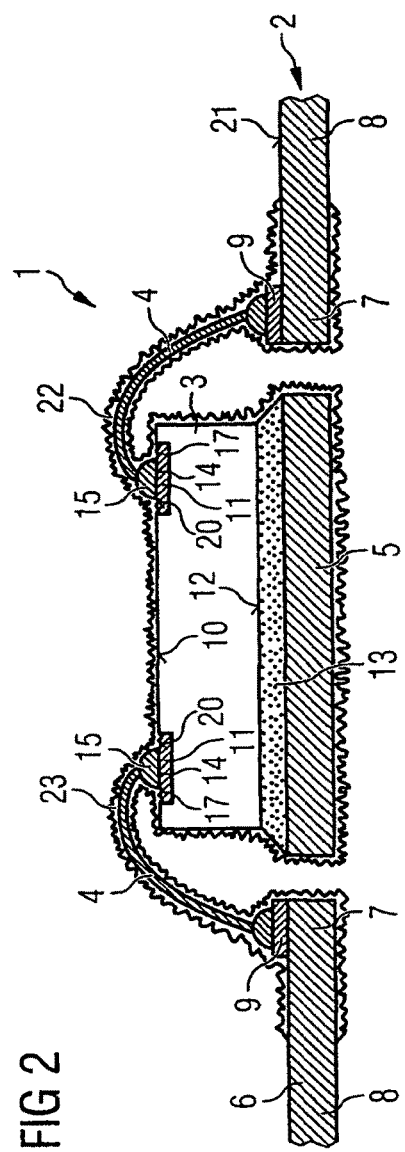
FIG 1
FIG 2

SEMICONDUCTOR PACKAGE AND METHOD OF ASSEMBLING A SEMICONDUCTOR PACKAGE

CROSS REFERENCE TO RELATED APPLICATIONS

This application is a continuation of International Application No. PCT/IB2006/001218, filed on May 10, 2006, entitled "Semiconductor Package and Method of Assembling a Semiconductor Package," the entire contents of which are hereby incorporated by reference.

BACKGROUND

It is known that encapsulated semiconductor packages, that include a plastic encapsulation material as the package housing, are susceptible to cracking during solder reflow. This phenomenon is commonly referred to as the "popcorn effect" and often results in the failure of the package. This cracking is the result of the accumulation of moisture within the semiconductor package which, as the package is heated to a higher temperature during the solder reflow process, vaporizes, causing a build up of vapor pressure within the package resulting in cracking of the encapsulation material. The mismatch in the coefficients of thermal expansion between dissimilar materials of the package (e.g., a metallic leadframe and plastic encapsulation material) can also lead to the formation of cracks, and even complete delamination, at the interfaces between these materials. Moisture is able to accumulate in these cracks, which exacerbates the popcorn effect during solder reflow. The problem of cracking is more severe for so-called "green" packages, which use non-leaded solder that requires a higher solder reflow temperature of around 260° C. The problem of cracking is also more sever for so-called "robust" packages which are required to withstand more extreme operating conditions (e.g., packages for automotive applications).

A known way to address this problem of cracking is to provide an additional adhesion promotion coating on the encapsulated elements of the semiconductor package. However, the improvements which are observed as a result of the additional adhesion promotion coating are limited and further improvements are desired.

SUMMARY

An encapsulated semiconductor package and a method of assembling an encapsulated semiconductor package are described herein. The semiconductor package comprises a semiconductor component including a circuit carrier including a plurality of inner contact pads, a semiconductor chip and a plurality of electrical connections. An adhesion promotion layer is disposed on at least areas of the semiconductor component and a plastic encapsulation material encapsulates at least the semiconductor chip, the plurality of electrical connections, and the plurality of inner contact pads. Surface regions of the semiconductor component are selectively activated.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Embodiments of the encapsulated semiconductor package and method will now be explained with reference to the diagrams, where:

FIG. 1 depicts the selective activation of the chip bond pads of a semiconductor component;

FIG. 2 illustrates the semiconductor component after the deposition of an adhesion promotion layer;

FIG. 3 shows scanning electron micrographs comparing adhesion promotion layers deposited on non-activated and activated surface regions;

FIG. 4 illustrates the chemical reaction by which the chip bond pads of FIG. 1 are activated;

FIG. 5 depicts an encapsulated semiconductor leadframe-based package including activated chip bond pads and an adhesion promotion layer; and FIG. 6 shows an encapsulated semiconductor package including a rewiring substrate, activated chip bond pads, and an adhesion promotion layer.

DETAILED DESCRIPTION

The described semiconductor packages and methods for assembling a semiconductor packages exhibit an improved adhesion between the embedded components and the plastic package material and a reduced cracking during the solder reflow process. The superior adhesion and minimal cracking exhibited in the described packages and methods are suitable for use in "green" packages and "robust" packages. The described methods for assembling the packages are simple and can be easily integrated into the manufacturing process.

The semiconductor package comprises a semiconductor component including: a circuit carrier, a semiconductor chip and a plurality of electrical connections. The circuit carrier comprises: a die pad, a plurality of inner contact pads, a plurality of outer contact areas and a rewiring structure which electrically connects the plurality of inner contact pads and the plurality of outer contact areas. The semiconductor chip comprises an active surface and a passive surface. The active surface of the semiconductor chip includes an integrated circuit device and a plurality of chip bond pads disposed on the active surface. The passive surface of the semiconductor chip is mounted on the die pad of the circuit carrier. The plurality of electrical connections extends between and electrically connects the plurality of chip bond pads with the plurality of inner contact pads of the circuit carrier. The semiconductor package further comprises an adhesion promotion layer and plastic encapsulation material. The adhesion promotion layer is disposed on at least areas of the semiconductor component. The plastic encapsulation material encapsulates: at least the upper surface of the die pad, the semiconductor chip, the plurality of electrical connections, and the plurality of the inner contact pads. Surface regions of the semiconductor component are selectively activated. The semiconductor component also comprises surface regions which are not selectively activated. In an embodiment of the described semiconductor component, the selectively activated regions are surrounded by regions which are not selectively activated. In an embodiment, the activated surface regions comprise an outer layer which has a different chemical composition to the underlying material of the region.

Defined regions which are to be activated are selected and the semiconductor component subjected to an appropriate treatment by which only the surface of the defined regions is activated. Other surface regions of the semiconductor component, which are not defined, are unactivated. The selective activation of surface regions of the semiconductor components, therefore, differs from a cleaning process since a cleaning process affects all free-lying surfaces.

The surface regions are selectively activated after the passive surface of the semiconductor chip has been mounted on the die pad of the circuit carrier and after the plurality of electrical connections have been formed which electrically connect the chip bond pads with the inner contact pads of the circuit carrier. Therefore, the interfaces between the electrical connections and the chip bond pads and between the electrical connections and inner contact pads remain free form the adhesion promotion layer. The interfaces do not provide free surfaces of the semiconductor component and are, therefore, not selectively activated.

The described semiconductor package provides an improved moisture resistance and reliability upon soldering due to the provision of an adhesion promotion coating which covers at least regions of the surfaces of the semiconductor component. The adhesion promotion layer provides an improved adhesion between the plastic encapsulation material which provides the package housing and the surfaces of the semiconductor component coated by the adhesion promotion layer. This hinders the formation of cracks due to the mismatch in thermal expansion coefficient of the materials of the semiconductor component and the plastic encapsulation material. Consequently, the accumulation of moisture in voids provided by cracks is prevented which eliminates one of the faults thought to result in the appearance of the popcorn effect during the solder reflow process. The described package is less likely to fail as a result of the solder reflow process performed by the customer in order to mount the package on a higher level substrate (e.g., a printed circuit board).

The surface regions of the semiconductor component which are selectively activated provide a surface on which the adhesion promotion layer may be more reliably deposited than if these regions were to remain unactivated. Therefore, if the semiconductor component comprises different materials (e.g., different metals) which have a different affinity for the material of the adhesion promotion layer (e.g., different wetting characteristics), the regions containing materials with a poorer affinity for the adhesion promotion layer may be selectively activated.

The selectively activated surface regions have an improved affinity for the material of the adhesion promotion layer. The selectively activated surface regions are, therefore, covered by, and are directly in contact with, the adhesion promotion layer. The adhesion promotion layer can then be more reliably deposited on to the selectively activated regions so that the overall coverage of the adhesion promotion layer on the surfaces of the semiconductor component is improved. Therefore, the reliability of the semiconductor package is improved as poor or patchy coverage of the adhesion promotion layer is avoided and, therefore, isolated crack formation in the uncoated regions is prevented.

The surfaces which have been previously found to be poorly coated by the adhesion promotion layer can be provided with a activation treatment which activates only these regions, leaving other regions of the semiconductor component, which were previously found to be reliably coated by the adhesion promotion layer, unaffected and unactivated.

The semiconductor component comprises inner portions and outer portions. The inner portions are defined as those portions of the semiconductor component which are positioned within the package housing and are encapsulated by the plastic encapsulation material and covered by the adhesion promotion layer. Outer portions of the semiconductor component are defined as those portions of the semiconductor component which are positioned outside of the package housing and are not encapsulated by the plastic encapsulation material.

In an embodiment of the described semiconductor package, the surface regions of the semiconductor component which are selectively activated are located on the inner portion of the semiconductor component. The inner portions of the semiconductor component also comprise regions which are unactivated. The selectively activated surface regions may be isolated regions disposed on the inner portion of the semiconductor component which are surrounded on all sides by inactivated regions.

In an embodiment, the exposed surfaces of the chip bond pads are selectively activated. In this context exposed surfaces denote those surfaces of the chip bond pads which are not occupied by the electrical connection disposed on the chip bond pad. Exposed does not necessarily mean that these surfaces of the chip bond pads are uncovered.

The surface of the chip bond pads which is occupied by the bond wire and which forms an interface with the electrical connection remains inactivated as the activation of the exposed surfaces of the chip bond pads is performed after the electrical connections have been made between the chip bond pads and the inner contact areas of the circuits carrier.

It has been found that in known methods the chip bonding pads exhibit poor or no coverage by the adhesion promotion layer. Known approaches to improve this problem have concentrated on treating the chip bond pads during the wafer fabrication stage, commonly referred to in the art as Front End. However, these known methods have the disadvantage that analysis is difficult at the wafer level and the quality of the pad activation or conditioning only becomes apparent at a much later stage in the manufacture of the package after the chip has been coated with the adhesion promotion layer. Furthermore, some known pad conditioning treatments have been found to contaminate gate areas of the integrated circuit devices present in the active surface of the semiconductor chip which has an unacceptable impact on the electrical robustness of the devices.

Typical production of a semiconductor package including a semiconductor chip is carried out in a different factory, commonly referred to as Back End, to that in which the semiconductor chip is manufactured. Therefore, if bond pad conditioning or activation is carried out at the wafer level, results from the packaging factory have to be relayed to the wafer manufacturer. Consequently, the optimization is time-consuming and improvements to the package may be delayed. The method described herein enables the pad conditioning or activation to be performed in the packaging factory at a stage just before the adhesion promotion coating is applied. This enables a faster optimization of the activation process as the results of the adhesion promotion coating can be immediately used to optimize the activation treatment.

The disadvantages of wafer-level conditioning are avoided by activation of only the exposed surfaces of the chip bond pads during the package assembly process. The package and methods described herein has the further advantage that the surfaces of the chip bond pads are activated only in those regions in which bond pad activation is actually necessary since the region of the chip bond pad occupied by the electrical connection is not coated by the adhesion promotion layer. A wider variety of activation processes are, therefore, in principle possible including the provision of non-electrically conductive or poorly electrically conductive activated surface regions.

The activated surface regions have an affinity for the material of the adhesion promotion layer which is to be included in the package and are suitable for the method by which the adhesion promotion layer is deposited. If electro-plating, for example, is used to deposit the adhesion promotion layer, the activated surfaces should be electrically conductive.

In an embodiment, the chip bond pads comprise aluminum and the exposed surfaces of the chip bond pads comprise hydroxyl-enriched aluminum oxide. Hydroxy-enriched aluminum oxide is formed by a hydroxylation process, for example, by treating the semiconductor component with boiling water or steam. This process may be carried out at approximately atmospheric pressure. The layer of aluminum oxide, present on the surface of the chip bond pads, reacts with the heated water or steam and forms a hydroxy-enriched aluminum oxide. Hydroxy-enriched aluminum oxide has the advantage that the chemical nature of the aluminum oxide changes and the transformation of the mainly hydroxyl-free aluminum oxide into a hydroxyl-enriched aluminum oxide results in the surface of the chip bond pad having a lower electrical resistance. Therefore, these exposed regions of the chip bond pads which include a surface layer of hydroxy-enriched aluminum oxide have a lower electrical resistance and, if the adhesion promotion layer is deposited by an electric chemical plating process, these regions can be more easily electroplated than untreated chip contact pads which comprise an outer surface layer of aluminum oxide.

In a further embodiment of the described package, the exposed surfaces of the chip bond pads comprise essentially fully hydroxylated aluminum oxide. The degree of the oxidation can be controlled by increasing the time to which the chip bond pads are exposed to steam or boiling water. By the creation of aluminum hydroxide bonds, the aluminum cation and partly loses its Lewis acidic character. The aluminum hydroxide bonds allow proton and charge transfer and increase the electrochemical reactivity. The adhesion promotion layer can, therefore, be more reliably deposited by electroplating on the activated exposed areas of the chip contact pads than is observed for non-activated exposed contact pads which include a native surface layer of aluminum oxide.

In a further embodiment, the exposed surfaces of the chip bond pads consist essentially of Boehmite (AlOOH) or Gibbsite (Al(OH)$_3$.

In an embodiment of the described package, the adhesion promotion layer covers essentially the whole of the surfaces of the semiconductor component which are encapsulated by the plastic encapsulation material. The adhesion promotion layer covers, therefore, essentially all portions of the surfaces of the inner portion of the semiconductor component. The adhesion promotion layer covers, therefore, the activated surfaces and unactivated surfaces of the semiconductor component.

In an embodiment, the adhesion promotion layer comprises zirconium (Zr) and chromium (Cr) and may also comprise zirconium oxide and chromium oxides. The adhesion promotion layer may comprise a dendritic structure. An advantage of a dendritic structure is that the surface area of the adhesion promotion layer is increased and a mechanical anchoring between the adhesion promotion layer and the plastic encapsulation material is provided. This further improves the adhesion between the embedded semiconductor components and the plastic encapsulation material.

In an embodiment of the described package, the circuit carrier comprises a leadframe strip. In this embodiment, the leadfingers of the leadframe strip provide the rewiring structure of the circuit carrier. The outer portion of each of the leadfingers provides the outer contact area of the rewiring structure.

In an alternative embodiment of the described package, the circuit carrier comprises a rewiring substrate. The rewiring substrate comprises a top surface on which the die pad and inner contact areas are located. The lower surface of the rewiring substrate comprises outer contact areas which are electrically connected by conducting tracks and vias to the inner contact surfaces. The conductor tracks and vias provide the rewiring structure of the circuit carrier in this embodiment.

The plurality of electrical connections may be provided by a plurality of bond wires. One or more bond wires may extend between each of the chip contact pads and an inner contact pad.

Methods of assembling a semiconductor package are also described herein. The method of assembling a semiconductor package comprises providing a semiconductor component. The semiconductor component comprises a circuit carrier, at least one semiconductor chip and a plurality of electrical connections. The circuit carrier comprises at least one device position. Each device position comprises a die pad, a plurality of inner contact pads, a plurality of outer contact areas and a rewiring structure which electrically connects the plurality of inner contact pads and the plurality of outer contact areas. The semiconductor chip comprises an active surface with integrated circuit devices and a plurality of chip bond pads and a passive surface. The passive surface of the semiconductor chip is mounted on the die pad of at least one device position of the circuit carrier. The plurality of electrical connections extends between and electrically connects the plurality of chip bond pads with the plurality of inner contact pads of the circuit carrier.

Surface regions of the semiconductor component are selectively activated and an adhesion promotion layer is deposited on at least areas of the semiconductor component. At least the upper surface of the die pad, the semiconductor chip, the plurality of electrical connections, and the plurality of the inner contact pads are encapsulated in plastic encapsulation material.

The described method allows for the surface regions of the semiconductor component to be selectively activated after the semiconductor component has been assembled and, in particular, after the passive surface of the semiconductor chip has been mounted on the die pad of the circuit carrier and after the electrical connections have been made between the chip bond pads and the inner contact pads of the circuit carrier. Therefore, the electrically conductive interfaces between the portions of the semiconductor component which are later encapsulated within the plastic encapsulation material of the package housing are formed before the selective activation of defined surface regions. Therefore, the contact resistance of the electrical connections and functionality of the package is not affected by the selective activation treatment.

As discussed above, defined regions of the semiconductor component are selectively activated forming activated surface regions. Other regions of the semiconductor component remain unactivated and are unaffected by the activation treatment. The surface regions which are to be activated may be chosen on the basis of previous knowledge which shows that these particular surface regions are poorly or insufficiently covered by an adhesion promotion layer, for example. The selectively activated surface regions have a greater affinity for the adhesion promotion layer than these surface regions before the activation process.

In an embodiment of the described method, regions of the semiconductor component art selectively activated by chemical means (i.e., a chemical process inducing a chemical reaction). The chemical means may be chosen so as to activate only those regions which it is desired to activate. The chemical means may, for example, form reaction products only with one material and not with the other materials of the semiconductor component under the conditions at which the activated treatment is performed. In this embodiment, only those regions of the semiconductor component comprising this material will be activated by the chemical means.

Regions of the semiconductor component may be selectively activated by chemical reaction of at least the surfaces of the regions with the chemical means. At least the surfaces of the regions may comprise an outer activated layer of a material which is the reaction product of the material of the region and the chemical means.

In an embodiment of the described method, essentially all portions of the surfaces of the semiconductor component are exposed to the chemical means and are in direct contact with the chemical means during the activation treatment. However, selected and defined regions of the semiconductor component are selectively activated by appropriate selection of the chemical means. Regions in which no activation of the surface is desired, fail to be activated and fail to chemically react with the chemical means.

A selective activation of defined regions of the semiconductor component may be simply achieved in the method according to the described method without the use of masking steps. This greatly simplifies the assembly process and has the additional advantage that very small regions may be selectively activated without the need for finely structured mask. Additional processing steps are, therefore, avoided. The selective activation of defined and desired regions occurs automatically by appropriate selection of the chemical means.

In one embodiment of the described method, regions of the semiconductor component are selectively activated by exposure to water in the liquid state or by water in the gaseous state. The water is preferably provided at a temperature in the range 60° C. to 100° C. and may be conveniently provided by boiling water or steam. Water has the advantage that complex handling conditions are not required and that materials costs are very low. In an embodiment, the semiconductor component is submerged in boiling water so that all the surfaces of the semiconductor component are in contact with the water for a certain time.

In an embodiment of the described method, exposed surfaces of the chip bond pads but selectively activated. Exposed surfaces of the chip bond pads are defined as those outer surfaces which on occupied by an electrical connection.

In an embodiment of the described method, the chip bond pads comprise aluminum and the activation process is carried out under conditions so that the exposed surfaces of the chip bond pads comprise hydroxy-enriched aluminum oxide. As previously discussed, the time to which the chip bond pads are exposed to water effects the extent of the reaction. The reaction kinetics also depends on the temperature of the water. Therefore, the conditions are adjusted until the exposed surfaces of the chip contacts comprise hydroxy-enriched aluminum oxide.

In a further embodiment of the method, the activation process is carried out under conditions so that the exposed surfaces of the chip bond pads comprise essentially fully hydroxylated aluminum oxide. Typically, the chip bond pads are exposed to water for a longer time to achieve a fuller transformation of the aluminum oxide into fully-hydroxylated aluminum oxide. The further embodiment, the activation process is carried out under conditions so that the exposed surfaces of the chip bond pads consist essentially of Boehmite or Gibbsite. In this embodiment of the invention, the chip bond pads comprise an outer layer of Boehmite or Gibbsite in the exposed areas. The region of the chip bond pad which is occupied by the electrical connection does not comprise Boehmite or Gibbsite.

The adhesion promotion layer may cover essentially all portions of the surfaces of the semiconductor component which are to be encapsulated by the plastic encapsulation material. These surfaces are defined as the inner portion of the semiconductor component. An essentially complete coverage of the surfaces ensures the best possible adhesion between the plastic encapsulation material and the embedded components.

In an embodiment of the described method, the adhesion promotion layer is deposited by an electrodeposition technique. This technique allows a coating or layer to be easily deposited on all surfaces of complex shapes. Since the semiconductor component is a three-dimensional object, electrodeposition and galvanic techniques are particularly advantageous.

In an embodiment of the describe method, the adhesion promotion layer comprises zirconium (Zr) and chromium (Cr) and may also comprise zirconium oxide and chromium oxides. The adhesion promotion layer may be deposited by a process known as A2 plating using a commercially available plating bath.

The adhesion promotion layer may be deposited under deposition conditions so as to produce a layer with a dendritic structure. The structure of an electrodeposition varies depending on the deposition conditions. Therefore, the conditions are chosen so as to produce a dendritic structure with the desired average thickness and surface roughness.

The encapsulation of at least the upper surface of the die pad, the semiconductor chip, the plurality of electrical connections, and the plurality of inner contact pads may be performed by the transfer molding process. This process is commonly used in the fabrication of encapsulated semiconductor packages and is, therefore, reliable and cost effectively used in the method of assembly according to the described method.

In an embodiment of the method, the circuit carrier is provided in the form of the leadframe strip, each device position of the leadframe strip providing a leadframe for a single semiconductor package. In an alternative embodiment, the circuit carrier is provided in the form of the rewiring substrate. The plurality of electrical connections may be provided by producing a plurality of wire bonds using a known wire-bonding technique.

In the following paragraphs, exemplary embodiments of the encapsulated semiconductor package and method are described in connection with the figures.

FIG. 1 illustrates a semiconductor component 1 which includes a leadframe 2, a semiconductor chip 3 and a plurality of bond wires 4. FIG. 1 shows the cross-sectional view of a single device position of a leadframe strip. The leadframe strip comprises a plurality of device positions arranged in rows and columns. Each device position provides a leadframe 2 for a single semiconductor package.

The leadframe 2 includes a die pad 5 and a plurality of leadfingers 6. The die pad 5 is disposed in approximately the lateral centre of the leadframe 2 and is laterally surrounded by the plurality of leadfingers 6 which, in this embodiment of the invention, lie in essentially the same plane as the die pad 5. Each leadfinger 6 comprises an inner portion 7, which will be encapsulated by the plastic encapsulation material of the package, and an outer portion 8 which extends outside of the plastic encapsulation material and provides the outer contact areas of the package. The inner portion 7 and outer portion 8 of the leadfingers 6 are illustrated with respect to the plastic encapsulation material in FIG. 5 which depicts the assembled semiconductor package.

An inner contact pad 9 is positioned on the upper surface of each leadfinger 6 towards the innermost end of the inner portion 7. The plurality of inner contact pads 9 comprise a material which is suitable for wirebonding and, in this embodiment of the invention, comprise Ni/NiP.

The leadframe 2 provides the circuit carrier of the semiconductor package. The leadfingers 6 provide the rewiring structure between the inner pads 9 and outer regions 8 of the plurality of leadfingers 6 which provide the outer contact regions of the semiconductor package.

The semiconductor chip 3 has an active surface 10 which comprises integrated circuit devices (which are not illustrated in the figures) and a plurality of chip contact pads 11. The chip contact pads 11 comprise aluminum. The semiconductor chip 3 also comprises a passive rear surface 12. The passive surface 12 of the semiconductor chip 3 is mounted on the upper surface of the die pad 5 by a layer of adhesive 13.

A plurality of bond wires 4 are provided which comprise gold. A bond wire 4 extends between each chip contact pad 11 and an inner contact pad 9 disposed on the inner portion 7 of each of the leadfingers 6. Typically, a chip bond pad 11 is electrically connected by a bond wire 4 to a leadfinger 6 which is laterally positioned adjacent the chip bond pad 11. The semiconductor component 1 comprises the leadframe 2, semiconductor chip 3 and the plurality of bond wires 4.

Each chip bond pad 11 comprises two types of regions. A first region 14 of the chip bond pad 11 is occupied by the interface formed between the end 15 of the bond wire 4 and the upper surface 16 of each bond pad 11. The first region 14 is, therefore, covered and unexposed. The second region 17 of each chip bond pad 11 is unoccupied by the end 15 of the bond wire 4. Therefore, the upper surface 16 of each chip bond pad 11 in the second region 17 is exposed. The plurality of chip bond pads 11 comprises aluminum which includes a native aluminum oxide layer 18 at the upper surface 16 in at least the exposed regions 17.

In the next stage of the method, the semiconductor component 1 is placed into boiling water for a certain time. During this stage, the exposed regions 17 of the chip bond pads 11 are selectively activated. This is indicated in FIG. 1 by the arrows 19. According to the invention, at least the upper surface 16 the second exposed region 17 of each bond pad 11 is activated so as to provide an improved adhesion between the plurality of chip bond pads 11 and an adhesion promotion layer which is to be deposited on the exposed regions 17 of the plurality of bond pads 11.

FIG. 2 illustrates the next stage in the method to assemble a semiconductor package. An adhesion promotion layer 22 is deposited on all of the free surfaces 21 of the semiconductor component 1 which are to be encapsulated by the plastic encapsulation material of the semiconductor package. The adhesion promotion layer 22 comprises zirconium and chromium and is deposited on the free surfaces 21 of the semiconductor component, for example, by electroplating (e.g., the process commonly referred to as an A2 plating process). A2 is the commercial name of the electroplating bath. The adhesion promotion layer 22 is deposited using electroplating conditions such that the layer 22 grows with a dendritic structure 23. The dendritic structure 23 provides a roughened surface, increasing the surface area of the layer 22, and providing an additional mechanical anchoring mechanism between the adhesion promotion layer 22 and the plastic encapsulation material of the package.

The adhesion promotion layer 22 is deposited on the semiconductor component 1 after the semiconductor chip 3 is mounted on the die pad 5 and after the bond wires 4 are formed between the chip contact pads 11 and inner contact pads 9 of the leadframe 2. This ensures that all of the surfaces 21 which are to be encapsulated within the plastic encapsulation material are coated with the adhesion promotion layer. This improves the adhesion between the plastic encapsulation material and the semiconductor component 1 and improves the reliability of the package.

The adhesion promotion layer 22 is typically deposited on a leadframe strip which comprises a plurality of device positions, each device position including a semiconductor component 1.

As can be seen in FIG. 2, the adhesion promotion layer 22 is deposited on the inner portions 7 of the leadfingers 6, the die pad 5, the surfaces of the semiconductor chip 3 and the bond wires 4. The exposed regions 17 of the chip bond pads 11 are also coated by the adhesion promotion layer 22. This is in contrast to semiconductor components which have not undergone the water treatment according to the invention. The exposed regions 17 have been activated by the water treatment and at least the surfaces of the exposed regions 17 have an improved affinity for the adhesion promotion layer 22.

The improvement in the deposition of the adhesion promotion layer 22 on the activated surfaces 20 in the exposed regions 17 of the aluminum chip bond pads 11 is illustrated by the comparison examples shown in FIG. 3.

FIG. 3 shows SEM micrographs of adhesion promotion layers 22 comprising zirconium and chromium, which were deposited using an A2 plating bath on the aluminum bond pads of power MOSFET devices.

FIG. 3a shows an SEM Micrograph for an adhesion promotion layer 22 deposited on an aluminum bond pad 11 of a non-robust power MOSFET devices. The exposed regions of the aluminum bond pad 11 were activated using a water-based activation treatment according to an embodiment of the described method. The chip bond pad 11 was not subjected to any other pad activation treatment. As can be seen in FIG. 3a, the adhesion promotion layer 22 was successfully deposited on the water activated chip bond pad 11.

FIG. 3b shows an SEM Micrograph for a robust power MOSFET device in which the aluminum chip bond pads 11 were previously given an insufficient conventional pad activation treatment. FIG. 3b shows that an adhesion promotion layer 22 was not deposited on the chip bond pad 11 and illustrates the problem of the poor deposition of the adhesion promotion layer on conventional chip bond pads.

FIG. 3c shows SEM Micrograph for a robust power MOSFET device in which the aluminum chip bond pads 11 were previously given an insufficient conventional pad activation treatment as in the device of FIG. 3b. The chip bond pads 11 of the device of FIG. 3c were then subjected to a water-based activation treatment according to an embodiment of the describe method. As can be seen in FIG. 3c, the adhesion promotion layer 22 was successfully deposited on the activated chip bond pad in contrast to the non-activated chip contact pad shown in FIG. 3b.

The exposed regions 17 of the chip bond pads 11, according to an embodiment of the described method, are selectively activated by a chemical reaction (e.g., a hydroxylation process). For example, the regions 17 can be selectively activated by exposing all of the free surfaces of the semiconductor component 1 to boiling water for a given period of time. It is thought that the aluminum oxide layer 18 present at the surface 16 of the exposed regions 17 of the aluminum chip bond pads 11 reacts with the hot water forming hydroxy-enriched aluminum oxide at the outermost surface 16. The other free surfaces of the semiconductor component 1 which are also in contact with the hot water remain unaffected as no chemical reaction takes place. The reaction between the hot water and the aluminum oxide layer 18 in the exposed regions 17 of the chip bond pads 11 is illustrated in FIG. 1 by the arrows 19.

Figure 4:
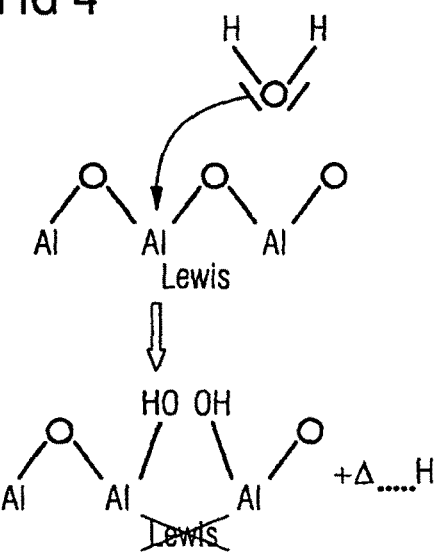

The chemical reaction which is believed to take place is illustrated in FIG. 4. The semiconductor component 1 is held in contact with the hot water until the aluminum oxide layer 18 has been transformed by chemical reaction into a fully hydroxylated aluminum oxide having a Gibbsite structure.

The use of the water-based procedure according to the described method alters the chemical nature of the aluminum oxide layer 18 present at the upper surface 16 of the chip bond pads 11. The fabricated aluminum chip bond pads 11 comprised of essentially hydroxy-free aluminum oxide which, upon exposure to boiling water, is transformed into a hydroxy-enriched aluminum oxide AlOOH (Boehmite) and AlO(OH)$_3$ (Gibbsite) which have a lower electrical resistance than aluminum oxide. Therefore, the activated surface areas 20 can be more easily plated by the adhesion promotion layer. The exposed regions 17 comprising the hydroxylated aluminum oxide are, therefore, activated.

FIG. 4 shows, schematically, the increasing hydroxylation of the aluminum oxide layer 18. The aluminum oxide bonds are broken, the aluminum cation partly loses its Lewis acidic character and Al—OH bonds are created. These allow proton and, therefore, charge transfer throughout the aluminum-oxo-hydroxide layer. Consequently, the electrochemical reactivity of the upper surface 16 of the bond pads 11 in the exposed regions 17 increases and an activated upper surface 20 is formed in the exposed regions 17 of the chip bond pads 11. The exposed region 17 of the chip bond pads 11 comprise an outer layer of hydroxyl-enriched aluminum oxide which is disposed on the bulk aluminum of which provides the chip bond pad 11.

Figure 5:
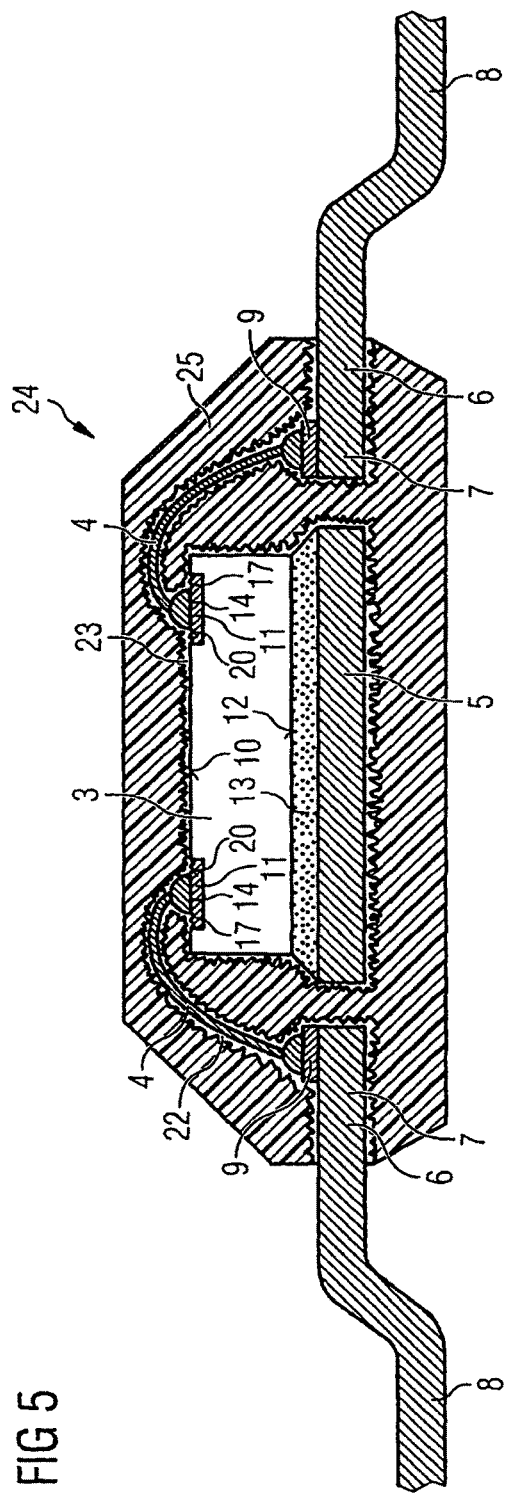

FIG. 5 illustrates the semiconductor component 1 including the activated chip bond pads 20 and adhesion promotion layer 22, as shown in FIG. 3, after a mold transfer process to produce the semiconductor package 24. The surfaces 21 of the semiconductor component 1 which are located within the semiconductor package 24 are coated by the adhesion promotion layer 22 with a dendritic structure 23. The activated surface regions 20 of the chip bond pads 11 are coated with adhesion promotion layer 22. The plastic encapsulation material 25 which forms the semiconductor package 24 is, therefore, in contact with the adhesion promotion layer 22.

The adhesion promotion layer 22 along with its dendritic structure 23 improves the adhesion between the surfaces 21 or the semiconductor component 1 which are located within the package 24 and the plastic encapsulation material 25. This improved adhesion hinders the formation of cracks between the semiconductor component 1 and the plastic encapsulation material 25 and, consequently, hinders the accumulation of moisture at the interfaces which, during a later solder reflow process, vaporizes, causing cracks in the package 24 and the phenomenon known as the popcorn effect.

Figure 6:
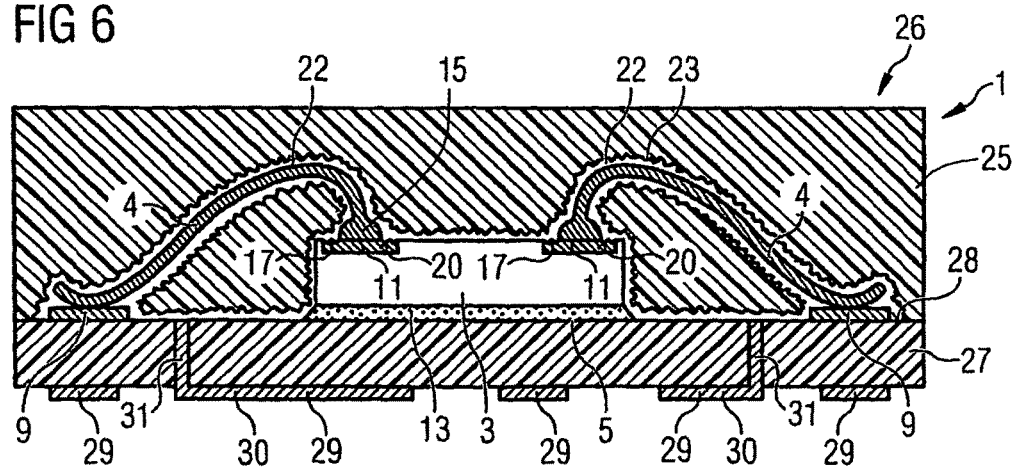

FIG. 6 illustrates an encapsulated semiconductor package 26 according to a second embodiment. The semiconductor package 26 comprises a circuit carrier, semiconductor chip and a plurality of bond wires 4.

In the second embodiment, the circuit carrier comprises a rewiring substrate 27. The rewiring substrate 27 has an upper surface 28 which includes a die pad 5 located in approximately the lateral center which is surrounded by a plurality of inner contact pads 9. The lower surface of the rewiring substrate 27 comprises a plurality of outer contact areas 28 which are electrically connected to the inner contact areas 9 positioned on the upper surface 28 of the rewiring substrate 27 by conductor tracks 29 and vias 30.

The semiconductor package 26 can be assembled by providing the rewiring substrate and mounting the passive surface 12 of the semiconductor chip 3 to the die pad 5. A plurality of bond wires 4 can then be produced, each extending between a chip contact or bond pad 11 and an inner contact pad 9 to provide a semiconductor component 1. The chip bond pads 11 comprise aluminum.

The semiconductor component 1 can then be subjected to boiling water which produced a selective activation of the exposed regions 17 of the chip contact pads 11 as described in conjunction with FIGS. 1 to 5. Therefore, the semiconductor package 26 also includes chip contact pads 11 in which the exposed regions 17 of the chip contact pads in 11 which are not occupied by the ends 15 of the bond wires 4 comprise at least partially hydroxylated aluminum oxide. The exposed regions 17 comprise an outer layer 20 which is disposed on aluminum which comprises the chip bond pad 11 and which was formed as a result of the water-based activation treatment previously described. The activated layer 20 present in the exposed regions 17 of the chip bond pads 11 comprises hydroxy-enriched aluminum oxide.

The upper surface 28 of the rewiring substrate 27, semiconductor chip 3, bond wires 4 and exposed regions 17 of the chip contact pads 11 can then be coated by, for example, A2 electroplating with the adhesion promotion layer 22. A transfer molding process can then be carried out to embed the surfaces coated by the adhesion promotion layer 22 in epoxy resin 25 to provide the semiconductor package 26.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method of assembling a semiconductor package, the method comprising:
   (a) providing a semiconductor component including: a circuit carrier comprising: at least one device position, each device position comprising a die pad, a plurality of inner contact pads, a plurality of outer contact areas, and a rewiring structure electrically connecting the plurality of inner contact pads and the plurality of outer contact areas; at least one semiconductor chip comprising an active surface with integrated circuit devices and a plurality of chip bond pads and a passive surface being mounted on the die pad of at least one device position of the circuit carrier; and a plurality of electrical connections extending between and electrically connecting the plurality of chip bond pads with the plurality of inner contact pads of the circuit carrier;
   (b) selectively activating surface regions of the semiconductor component;
   (c) depositing material to form an adhesion promotion layer on at least areas of the semiconductor component such that the selectively activated surface regions of the semiconductor component have improved affinity for the material of the adhesion promotion layer; and
   (d) encapsulating at least the upper surface of the die pad, the semiconductor chip, the plurality of electrical connections and the plurality of the inner contact pads in plastic encapsulation material.

2. The method of claim 1, wherein the surface regions are selectively activated via chemical reaction.

3. The method of claim 2, wherein the chemical reaction comprises a hydroxylation process.

4. The method of claim 3, wherein the hydroxylation process comprises exposing regions of the semiconductor component to boiling water or steam.

5. The method of claim 2, wherein the chemical reaction selectively activates exposed surfaces of the chip bond pads.

6. The method of claim 5, wherein the chip bond pads comprise aluminum and the activation process forms hydroxy-enriched aluminum oxide along the exposed surfaces of the chip bond pads.

7. The method of claim 6, wherein the activation process forms essentially fully hydroxylated-aluminum oxide along the exposed surfaces of the chip bond pads.

8. The method of claim 7, wherein the activation process forms essentially Boehmite or Gibbsite along the exposed surfaces of the chip bond pads.

9. The semiconductor package of claim 1, wherein the adhesion promotion layer comprises Zr and Cr.

10. The method of claim 1, wherein (c) comprises:
covering essentially all portions of the surfaces of the semiconductor component which are to be encapsulated by the plastic encapsulation material with the adhesion promotion layer.

11. The method of claim 1, wherein (c) comprises:
depositing the adhesion promotion layer via an electro-deposition technique.

12. The method of claim 1, wherein (c) comprises:
producing a dendritic structure along a surface of the adhesion promotion layer.

13. The method of claim 1, wherein the circuit carrier comprises one of a leadframe strip and a rewiring substrate.

14. The method of claim 1, wherein the plurality of electrical connections comprises wire bonds.

15. A semiconductor package, comprising:
a semiconductor component comprising: a circuit carrier including a die pad, a plurality of inner contact pads, a plurality of outer contact areas, and a rewiring structure electrically connecting the plurality of inner contact pads and the plurality of outer contact areas; a semiconductor chip comprising an active surface with integrated circuit devices and a plurality of chip bond pads and a passive surface being mounted on the die pad; and a plurality of electrical connections extending between and electrically connecting the plurality of chip bond pads with the plurality of inner contact pads of the circuit carrier, wherein exposed regions of the chip bond pads are activated surface regions of the semiconductor component and surface regions of the semiconductor component other than the exposed regions of the chip bond pads are unactivated surface regions;
an adhesion promotion layer comprising adhesion promotion material disposed on at least a portion of the activated surface regions and at least a portion of the unactivated surface regions of the semiconductor component, wherein the activated surface regions have a greater affinity for the adhesion promotion material in an activated state than in an unactivated state; and
a plastic encapsulation material encapsulating at least the upper surface of the die pad, the semiconductor chip, the plurality of electrical connections, and the plurality of the inner contact pads.

16. The semiconductor package of claim 15, wherein the chip bond pads comprise aluminum and upper surfaces of the chip bond pads comprise hydroxy-enriched aluminum oxide.

17. The semiconductor package of claim 16, wherein the upper surfaces of the chip bond pads comprise essentially fully hydroxylated-aluminum oxide.

18. The semiconductor package of claim 17, wherein the upper surfaces of the chip bond pads consist essentially of Boehmite or Gibbsite.

19. The semiconductor package of claim 15, wherein the adhesion promotion layer covers essentially all portions of the surfaces of the semiconductor component which are encapsulated by the plastic encapsulation material.

20. The semiconductor package of claim 15, wherein the adhesion promotion layer comprises Zr and Cr.

21. The semiconductor package of claim 15, wherein the adhesion promotion layer comprises a dendritic structure.

22. The semiconductor package of claim 15, wherein the circuit carrier comprises one of a leadframe strip and a rewiring substrate.

23. The semiconductor package of claim 15, wherein the plurality of electrical connections comprises wire bonds.

24. A method of assembling a semiconductor package, the method comprising:
(a) providing a semiconductor component including: a circuit carrier comprising: at least one device position, each device position comprising a die pad, a plurality of inner contact pads, a plurality of outer contact areas, and a rewiring structure electrically connecting the plurality of inner contact pads and the plurality of outer contact areas; at least one semiconductor chip comprising an active surface with integrated circuit devices and a plurality of chip bond pads and a passive surface being mounted on the die pad of at least one device position of the circuit carrier; and a plurality of electrical connections extending between and electrically connecting the plurality of chip bond pads with the plurality of inner contact pads of the circuit carrier;
(b) selectively activating surface regions of the semiconductor component via chemical reaction, including exposed surfaces of the chip bond pads, wherein the chip bond pads comprise aluminum and the activation process forms hydroxy-enriched aluminum oxide along the exposed surfaces of the chip bond pads;
(c) depositing an adhesion promotion layer on at least areas of the semiconductor component; and
(d) encapsulating at least the upper surface of the die pad, the semiconductor chip, the plurality of electrical connections and the plurality of the inner contact pads in plastic encapsulation material.

* * * * *